(12) United States Patent
Shimoida et al.

(10) Patent No.: US 7,859,015 B2
(45) Date of Patent: Dec. 28, 2010

(54) SEMICONDUCTOR DEVICE

(75) Inventors: Yoshio Shimoida, Yokosuka (JP);
Masakatsu Hoshi, Yokohama (JP);
Tetsuya Hayashi, Yokosuka (JP);
Hideaki Tanaka, Yokohama (JP);
Shigeharu Yamagami, Yokohama (JP)

(73) Assignee: Nissan Motor Co., Ltd., Yokohama (JP)

( * ) Notice: Subject to any disclaimer, the term of this patent is extended or adjusted under 35 U.S.C. 154(b) by 0 days.

(21) Appl. No.: 12/423,207

(22) Filed: Apr. 14, 2009

(65) Prior Publication Data
US 2009/0200575 A1 Aug. 13, 2009

Related U.S. Application Data

(62) Division of application No. 11/377,909, filed on Mar. 16, 2006, now Pat. No. 7,588,961.

(30) Foreign Application Priority Data

| Mar. 30, 2005 | (JP) | ............................. 2005-098636 |
| Mar. 31, 2005 | (JP) | ............................. 2005-100706 |

(51) Int. Cl.
*H01L 31/072* (2006.01)
(52) U.S. Cl. ............................... 257/192; 257/E29.081
(58) Field of Classification Search ............... 257/183, 257/E29.081
See application file for complete search history.

(56) References Cited

U.S. PATENT DOCUMENTS

| 5,877,515 A * | 3/1999 | Ajit ............................... 257/76 |
| 6,057,558 A | 5/2000 | Yamamoto et al. |
| 6,246,077 B1 * | 6/2001 | Kobayashi et al. ............ 257/77 |
| 2005/0062048 A1 | 3/2005 | Hayashi et al. |

FOREIGN PATENT DOCUMENTS

| EP | 0 726 604 A2 | 8/1996 |
| JP | 2003-318398 | 11/2003 |

OTHER PUBLICATIONS

Shinsuke Harada et al., "8.5-mΩ·cm² 600V Double-Epitaxial MOSFETs in 4H-SiC", IEEE Electoron Device Letters, vol. 25, No. 5, May 2004, 3 pages.

* cited by examiner

*Primary Examiner*—Chandra Chaudhari
(74) *Attorney, Agent, or Firm*—Global IP Counselors, LLP

(57) ABSTRACT

A semiconductor device is provided with a semiconductor region, a gate electrode, a source electrode and a drain electrode. The semiconductor region is formed on a semiconductor substrate surface and includes a first semiconductor portion of a first conducting type, a second semiconductor portion of a second conducting type, a band gap distinct from the substrate's band gap, more than two accumulated semiconductor layers, and junctions between the layers. The semiconductor layers each contain an impurity of the first conducting type. The gate electrode adjoins a heterojunction between the second semiconductor portion and the semiconductor substrate through a gate insulation film. The source electrode is coupled to the semiconductor region. The drain electrode is coupled to the semiconductor substrate.

12 Claims, 16 Drawing Sheets

SEMICONDUCTOR DEVICE

CROSS-REFERENCE TO RELATED APPLICATIONS

This application is a divisional application of U.S. patent application Ser. No. 11/377,909 filed on Mar. 16, 2006. The entire disclosure of U.S. patent application Ser. No. 11/377, 909 is hereby incorporated herein by reference.

This application claims priority under 35 U.S.C. §119 to Japanese Patent Application No. 2005-098636, filed Mar. 30, 2005, and Japanese Patent Application No. 2005-100706, filed Mar. 31, 2005, the entire disclosure of each being hereby incorporated herein by reference.

BACKGROUND OF THE INVENTION

1. Field of the Invention

The present invention relates to semiconductor devices. More specifically, the present invention relates to a semiconductor device that exhibits an increased resistance and reduced leakage current in a reverse-biased state, and a method for manufacturing such a semiconductor device.

2. Background Information

Conventional semiconductor devices include a semiconductor substrate, such as a silicon carbide substrate, onto which an epitaxial layer is deposited. As one example, the semiconductor device may include an N+ silicon carbide substrate onto which an N− type silicon carbide epitaxial layer is deposited. An N− type polycrystalline silicon layer and an N+ type polycrystalline silicon layer are deposited on the surface of the epitaxial layer of the semiconductor substrate and adjoin one another. A gate insulation film located adjacent to a bonded part between the N− type silicone carbide epitaxial layer and the N+ type polycrystalline silicon layer forms a gate electrode. The N− type polycrystalline silicon layer connects to a source electrode and a drain electrode on the rear surface of the N+ type silicon carbide substrate.

The conventional semiconductor device, described above, works as a switch by grounding the source electrode, applying a predetermined positive voltage to the drain electrode and controlling the electric potential of the gate electrode. When the gate electrode is grounded, a reverse bias is applied to the hetero bonding between the N− type polycrystalline silicon layer and the epitaxial layer, and the hetero bonding between the N+ type polycrystalline silicon layer and epitaxial layer and no current passes between the drain electrode and the source electrode. However, when a predetermined positive voltage is applied to the gate electrode, a gate electric voltage is generated on the hetero bonded interface between the N+ type polycrystalline silicon layer and the epitaxial layer and the thickness of the energy barrier which is created by the hetero bonded surface of the interface of the gate insulation film is decreased. Therefore, a current passes between the drain electrode and the source electrode.

When the N− type polycrystalline silicon layer is connected to the N− type silicon carbide layer and a positive voltage is applied to the N− type silicon carbide, a small amount of the electrons inside the N− type polycrystalline silicon layer pass through the energy barrier on the hetero bonded interface. Furthermore, the electrons inside the N− type polycrystalline silicon layer which are energetically excited cut across the energy barrier and flow to the N− type silicon carbide layer. In this way, the electrons inside the N− type polycrystalline silicon layer flow to the N− type silicon carbide layer becoming a leakage current.

SUMMARY OF THE INVENTION

In one embodiment, a semiconductor device comprises a semiconductor region that is formed on a surface of a semiconductor substrate. The semiconductor region is comprised of a first semiconductor portion of a first conducting type and a second semiconductor portion of a second conducting type, and a band gap that is different from a band gap of the semiconductor substrate. The semiconductor region is also comprised of more than two accumulated semiconductor layers into which an impurity of the first conducting type is introduced, respectively, and junctions disposed between the more than two accumulated semiconductor layers. The semiconductor device further includes a gate electrode adjoining a heterojunction between the second semiconductor portion and the semiconductor substrate through a gate insulation film, a source electrode coupled to the semiconductor region, and a drain electrode coupled to the semiconductor substrate.

The details of one or more embodiments of the invention are set forth in the accompanying drawings and the description below. Other features, objects, and advantages of the invention will be apparent from the description and drawings, and from the claims.

DETAILED DESCRIPTION

In general, this disclosure describes a semiconductor device that exhibits an increased resistance and reduced leakage current in a reverse-biased state, and a method for manufacturing such a semiconductor device. For example, in one embodiment, the increased resistance in the reverse-biased state is obtained by introducing either a P+ or P− type impurity in a polycrystalline silicon layer formed on an N− type epitaxial layer. Additionally, the semiconductor device maintains a low resistance in a forward-biased state. To keep the forward-biased resistance low, the polycrystalline silicon layer in the vicinity of a gate electrode may be of an N+ type. Furthermore, an N+ type source extracting region is formed on the surface of the polycrystalline silicon layer to connect a source electrode to a drain electrode and maintain a low resistance when forward-biased.

The reduced leakage current and increased resistance in the reverse-bias state results from the P+ or P− type polycrystalline silicon layer having few electrons present, thus reducing the amount of the electrons which pass through the energy barrier on the hetero bonded interface compared to the case where the polycrystalline silicon layer is an N type. Furthermore, the amount of the electrons which flow to the N− type silicon carbide layer after cutting cross the energy barrier may also by reduced by using a P type polycrystalline silicon layer.

Figure 1A:
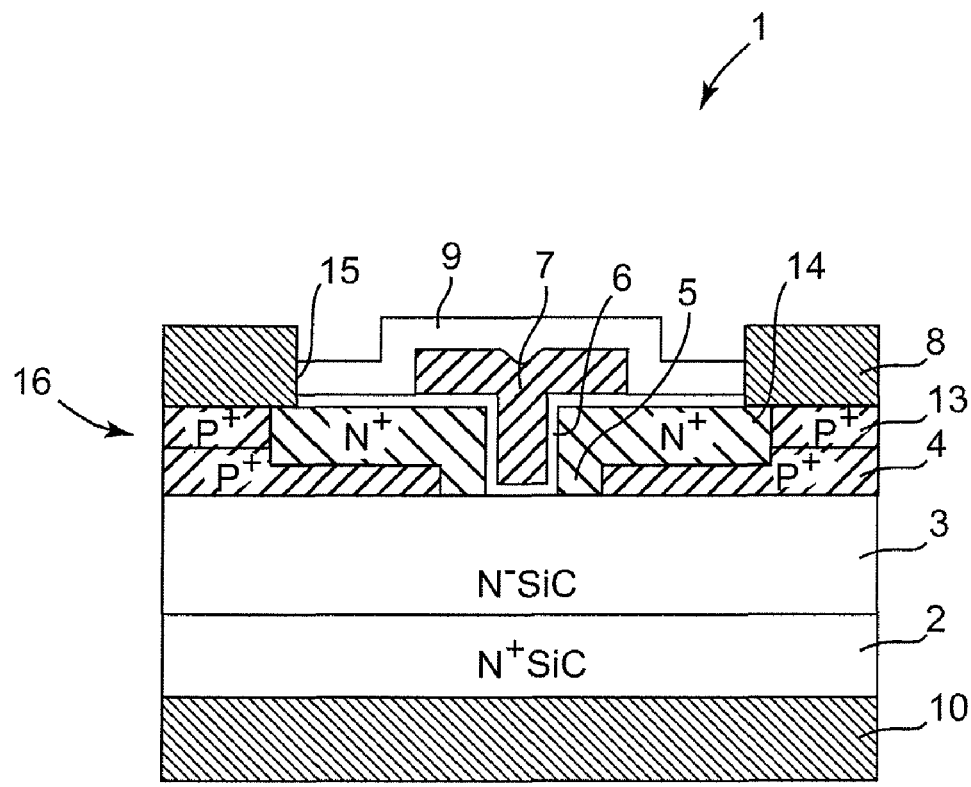
FIGS. 1A and 1B are schematic diagrams illustrating a cross-section of a semiconductor device.
Figure 1B:
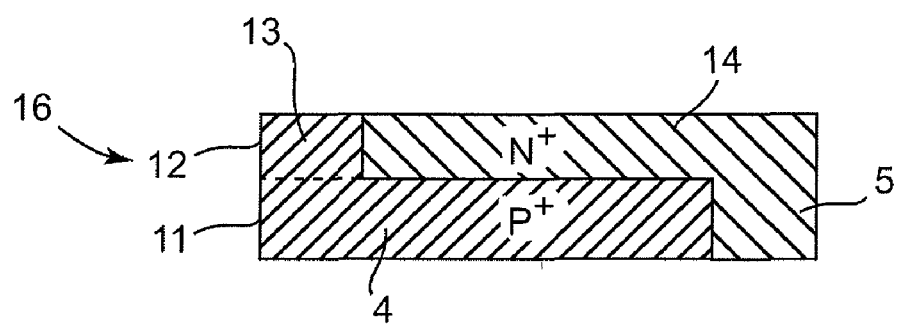

FIGS. 1A and 1B are schematic diagrams illustrating a cross-section of a semiconductor device 1. More specifically, the embodiment illustrated in FIG. 1A is a cross-section of a field-effect transistor of semiconductor device 1.

Semiconductor device 1 includes a high concentration N (i.e., N+) type silicon carbide (SiC) substrate 2. Semiconductor device 1 also includes a low concentration N (i.e., N−) type SiC layer deposited on a main surface of N+ type SiC substrate 2 to form an N− type SiC drain region 3. Drain region 3 may be formed, for example, by depositing an epitaxial layer on N+ type SiC substrate 2. SiC substrate 2 may be composed of a polytype (crystal polymorph), such as 4H—SiC, 6H—SiC, 3C—SiC or the like. In one embodiment, SiC substrate 2 is approximately 100 micrometers thick, and drain region 3 ranges from a few micrometers to ten micrometers thick.

A hetero semiconductor region 16 is formed on drain region 3. Hetero semiconductor region 16 comprises a P+ type first hetero semiconductor portion 4 deposited on a first portion of a main surface of the N− type SiC drain region 3. The P+ type first hetero semiconductor portion 4 may be formed using polycrystalline silicon. The band gap and electron affinity of SiC and polycrystalline Si is different, thus allowing the polycrystalline silicon to form a hetero semiconductor junction. The hetero junction is formed at the interface between the N− type SiC drain region 3 and P+ type first hetero semiconductor portion 4. In addition, an N+ type second hetero semiconductor portion 5 is deposited on a second portion of the main surface of the N− type SiC drain region 3. The N+ type second hetero semiconductor portion 5 is adjacent to the P+ type first hetero semiconductor portion 4. More specifically, the N+ type second hetero portion 5 is adjacent to the junction between N− type SiC drain region 3 and P+ type first hetero semiconductor portion 4. FIG. 1B, described below, is a schematic diagram illustrating an enlarged cross section of the hetero semiconductor region 16.

Semiconductor device 1 further includes a gate insulation film 6 deposited adjacent to second hetero semiconductor portion 5. A gate electrode 7 is formed next to gate insulation film 6. The P+ type first hetero semiconductor portion 4 is connected to a source electrode 8 through a P+ type contact region 13. Additionally, the N+ type second hetero semiconductor portion 5 is electrically connected to the source electrode 8 through an N+ type source extraction region 14. A drain electrode 10 is electrically connected to the backside of SiC substrate 1. Gate electrode 7 is separated from the source electrode 8 by an interlayer insulation film 9. Interlayer insulation film 9 includes a contact hole 15.

FIG. 1B is a schematic diagram illustrating a cross-section of the hetero semiconductor region 16 in further detail. Hetero semiconductor region 16 includes a first polycrystalline Si layer 11 and a second polycrystalline Si layer 12 formed on a main surface of first polycrystalline Si layer 11. First polycrystalline Si layer 11 includes P+ type first hetero semiconductor portion 4 and N+ type second hetero semiconductor portion 5. Second polycrystalline Si layer 12 consists of P+ type contact region 13 and N+ type source extraction region 14.

Most of the hetero junction is between P+ type polycrystalline Si and the N− type drain region, and the barrier height in that interface is large. Since the region in which the current is driven by electric field from the gate electrode 7 is the hetero junction of the N+ type polycrystalline Si and N− type drain region, resistance exhibited during the forward-biased or "on" state is reduced, while at the same time obtaining increasing the resistance exhibited during reverse-bias.

The semiconductor substrate may be composed of materials other than SiC, such as gallium nitride or diamond. In one embodiment, the hetero semiconductor region contains at least silicon. For example, the hetero semiconductor region may be composed of at least one of monocrystalline silicon, polycrystalline silicon, amorphous silicon, monocrystalline silicon germanium, polycrystalline silicon germanium, amorphous silicon germanium. In other embodiments, the hetero semiconductor region may comprise a monocrystalline germanium, polycrystalline germanium, amorphous germanium, monocrystalline gallium arsenide, polycrystalline gallium arsenide, or amorphous gallium arsenide. These materials allow a reduction in the number of manufacturing steps in a manufacturing method for a semiconductor device comprising common materials, and allow the provision of a manufacturing method of a semiconductor device with less variation in the element characteristics.

Figure 2A:
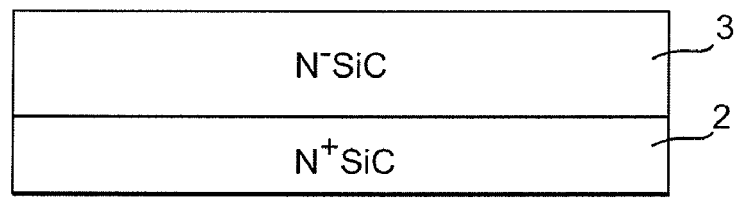
FIGS. 2A-2J are schematic diagrams illustrating an exemplary manufacturing method for forming a semiconductor device.

FIGS. 2A-2J illustrates an exemplary manufacturing method for forming a semiconductor device, such as semiconductor device 1 of FIG. 1. Initially, N− type SiC drain region 3 is deposited on one main surface of N+ type SiC substrate 2, as illustrated in FIG. 2A. As described above, the N− type SiC drain region 3 may deposited on the main surface of N+ type SiC substrate 2 using epitaxy. After N− type SiC drain region 3 is deposited on the main surface, it may be cleaned by preprocessing techniques.

Figure 2B:
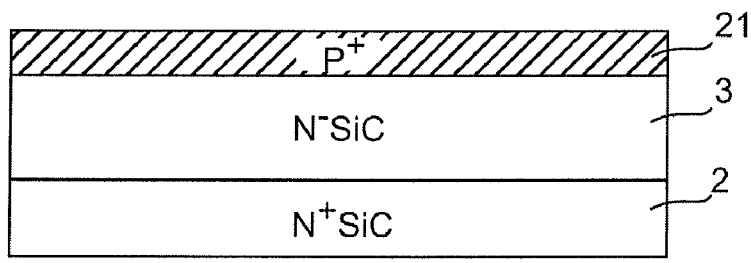

A first layer of polycrystalline Si 21 is formed on a surface of N− type SiC drain region 3, as illustrated in FIG. 2B. Impurities may be introduced (i.e doped) to polycrystalline Si layer 21 to convert it to a P+ type layer. The impurities may be introduced to polycrystalline Si layer 21 using ion implantation, vapor phase diffusion or any other suitable means. In one embodiment, boron (B) may be introduced to polycrystalline Si layer 21 to convert the layer to a P+ type layer.

Figure 2C:
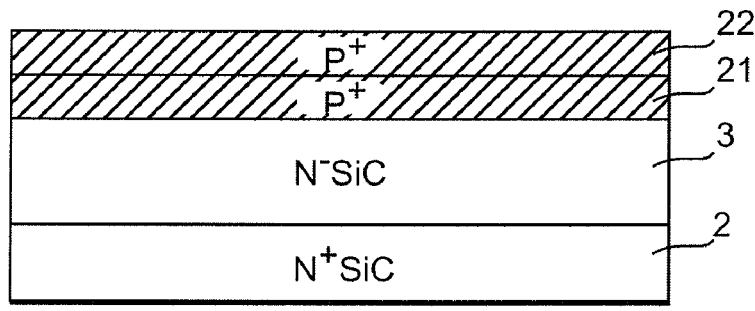

FIG. 2C illustrates a second polycrystalline Si layer 22 that is formed on a top surface of polycrystalline Si layer 21. As described above with respect to polycrystalline Si layer 21, impurities may be introduced to the polycrystalline Si layer 22 to convert it to a P+ type layer. Although in the embodiment described polycrystalline Si layers 21 and 22 are entirely P+ type layers, impurities may be introduced to intended regions to selectively pattern portions of the layer as P+ type.

Figure 2D:
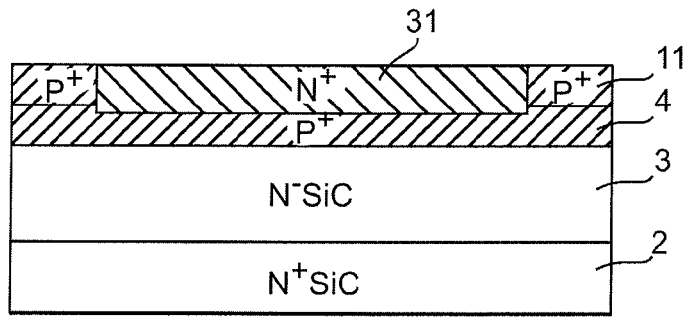

As illustrated in FIG. 2D, impurities are introduced in a region of second polycrystalline Si layer 22 to form an N+ type impurity region 31. N+ type impurity region 31 is formed to provide N+ type source extraction region 14 of FIG. 1. As illustrated in FIG. 2D, introduction of the N type impurity into the region of the second polycrystalline Si layer 22 does not affect the P+ type region at the bottom of the first polycrystalline Si layer 21. The diffusion of the impurity within second polycrystalline Si layer 22 may, however, affect a top portion of the P+ type region of the first polycrystalline Si layer 21. The P+ type region of the first polycrystalline Si layer 21 is P+ type first hetero semiconductor portion 4. The impurities may be introduced into the region of second polycrystalline Si layer 22 using ion implantation, vapor phase diffusion or other suitable technique. In one embodiment, arsenic (As) may be introduced into the region of second polycrystalline Si layer 22 to form N+ type impurity region 31.

Figure 2E:
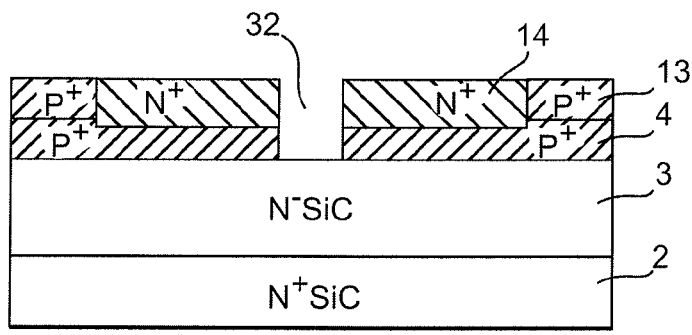

FIG. 2E shows an etched portion 32. Etched portion 32 is formed by etching away the accumulated polycrystalline Si layers in a location where gate electrode 7 (FIG. 1) will be formed. Specifically, a portion of N+ type impurity region 31 and a portion of first polycrystalline Si layer 21 are etched away such that etched portion 32 extends down to the N− type SiC drain region 3.

Figure 2F:
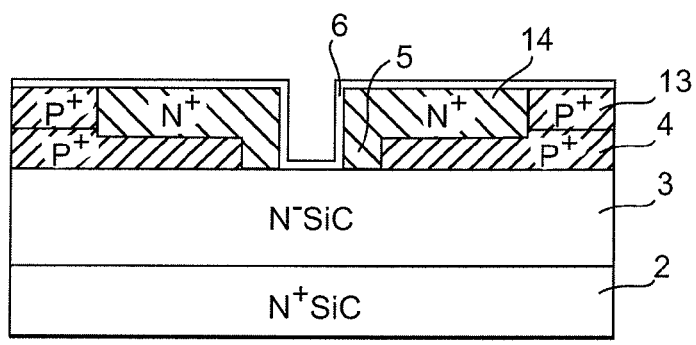

N+ type second hetero portion 5 is formed in portions of P+ type first hetero semiconductor portion 4, as shown in FIG. 2F. Particularly, impurities are introduced into the portions of P+ type first hetero semiconductor portion 4 adjacent to the sides of etched portion 32. In one embodiment, an etch mask used for the etching is also used to introduce impurities into the portions of P+ type first hetero semiconductor portion 4. For example, impurities may be implanted using diagonal rotation ion implantation to selectively introduce impurities into the sides of the etching portion 32, thus forming the N+ type second hetero semiconductor portion 5. Alternatively, introduction of impurities by diffusion from the depo-film may be used to form N+ type second hetero semiconductor portion 5. In another embodiment, the impurities may be introduced from the surface using a different photo-mask than was used for the etching to form N+ type second hetero semiconductor portion 5. Gate insulation film 6 accumulates over the exposed layers. In one embodiment, gate insulation film 6 may consist of a silicon dioxide film, and may accumulate to a thickness of about 100 to 1000 angstrom.

Figure 2G:
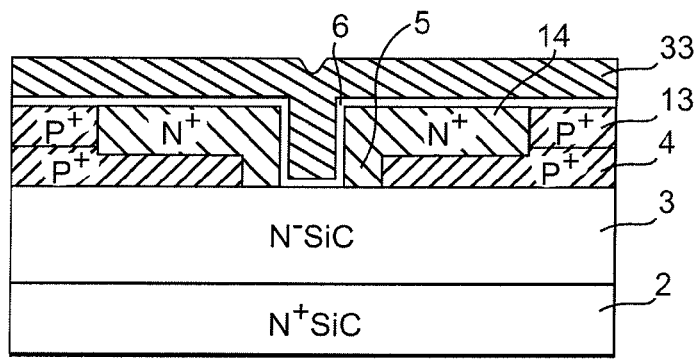
Figure 2H:
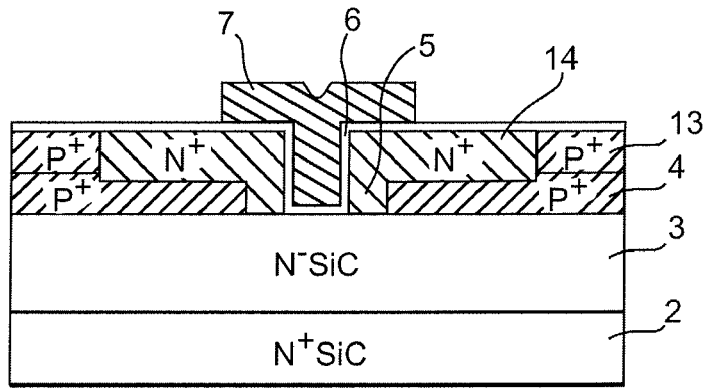

FIG. 2G illustrates a polycrystalline Si layer 33 that is deposited on gate insulation film 6. Polycrystalline Si layer 33 is adjusted to a thickness that sufficiently buries etching portion 32. A portion of polycrystalline Si layer 33 is etched according to a pattern to form gate electrode 7, as illustrated in FIG. 2H. This patterning forms gate electrode 7 to an intended shape.

Figure 2I:
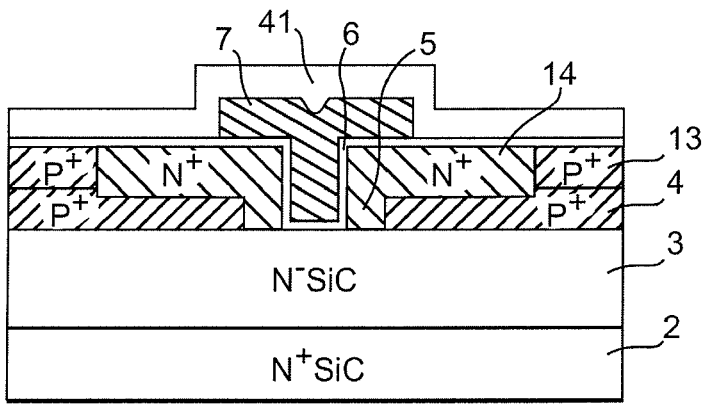
Figure 2J:
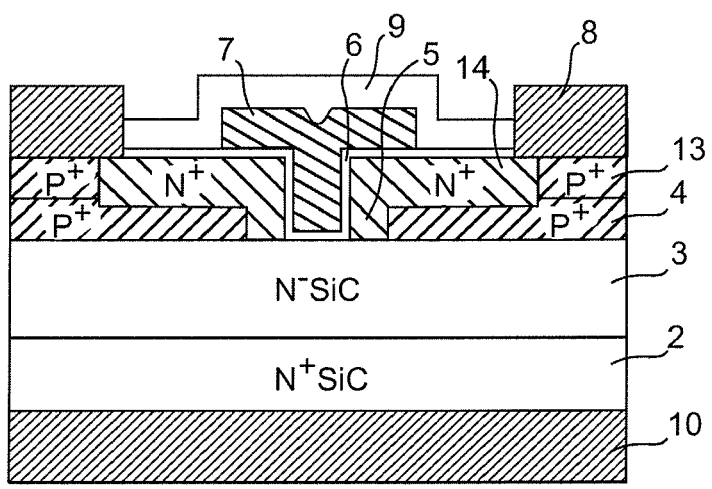

An interlayer insulation film 41 is formed to cover gate electrode 7 and gate insulation film 6, as illustrated in FIG. 2I. A contact hole 15 is formed in a part of the interlayer insulation film 41, as illustrated in FIG. 2J. As further illustrated in FIG. 2J, source electrode 8 is electrically connected to hetero semiconductor portion 4 through P+ type contact region 13. P+ type contact region may, for example, provide electrical connection between electrode 8 and hetero semiconductor portion 4. The electrical connection between source electrode 8 and hetero semiconductor portion 4 may be via a metal. Additionally, drain electrode 10 is formed on the backside of the substrate 2 so that it is electrically connected to substrate 2. Drain electrode 10 may, for example, be formed from metal or other conductor. Drain electrode 10 may, for example, be connected along the entire main surface of substrate 2. Alternatively, drain electrode 10 may be only connected to a portion of the main surface of substrate 2.

Figure 3:
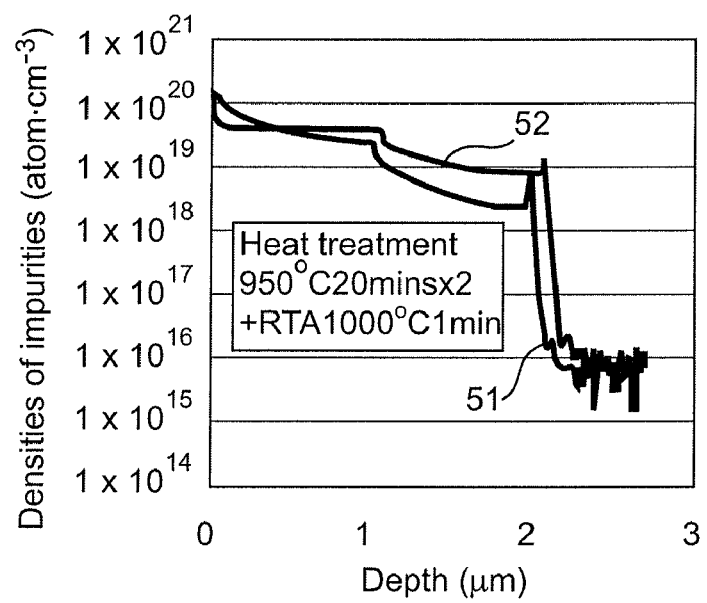
FIG. 3 is a graph illustrating the depth of diffusion of the impurities into a polycrystalline silicon layer as a function of the densities of the impurities.

FIG. 3 is a graph illustrating the depth of diffusion of the impurities into a polycrystalline Si layer as a function of the densities of the impurities. The horizontal axis shows the distance downward into the depth of the polycrystalline Si layer in micrometers, and the vertical axis shows the densities of the N type impurities in atom·cm$^{-3}$. In the embodiment illustrated in FIG. 3, the N type impurity is arsenic (As). The results illustrated in the graph of FIG. 3 are the results after two heat treatments of 20 minutes at 950 degrees C., and after that, one minute RTA (Rapid Thermal Anneal) at 1000 degrees C.

The graph of FIG. 3 illustrates the depth of diffusion for two types of backgrounds; line 51 represents a B+ doped background and line 52 represents a non-doped background. The B+ doped background is formed when B is first introduced to the layer and becomes a P+ type. The non-doped background is formed from polycrystalline silicon without any P type impurities introduced into it. The As accumulates in the interfaces created from the assembling of the polycrystalline Si into a laminated structure. In the case of B+ dope background (line 51), the As distribution is shallow and the surface concentration is high. This phenomenon is applied to the structure of the field-effect transistor using the hetero junction.

Figure 4:
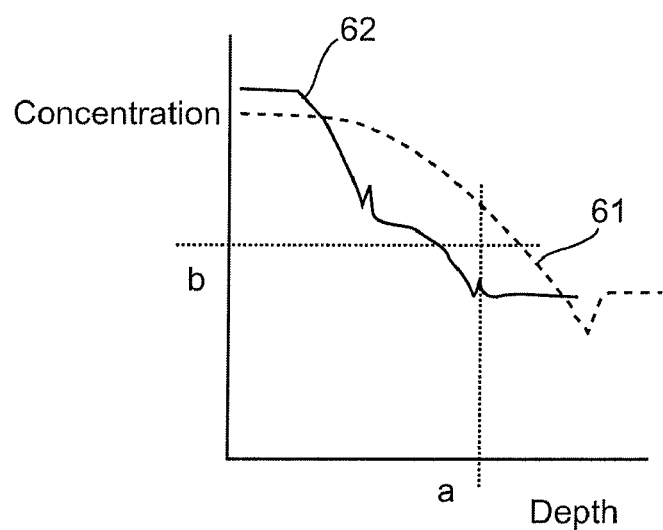
FIG. 4 is a graph illustrating the depth of diffusion of impurities as a function of concentration.

FIG. 4 is a graph illustrating the depth of diffusion as a function of concentration. The horizontal axis shows the depth of diffusion of the impurities into the polycrystalline Si layer, and the vertical axis shows the concentration of the N type impurity, in this case As. The dashed line is an As distribution 61 into a polycrystalline Si layer that is not a laminated structure, and the solid line is an As distribution 62 into a polycrystalline Si layer that is a laminated structure.

In the As distribution 61 into the polycrystalline Si layer that is not a laminated structure, the surface concentration is lower and it is distributed to a deeper position in the polycrystalline Si layer. On the other hand, in the As distribution 62 into the polycrystalline Si layer that is a laminated structure, the surface concentration is high and the distribution is shallow. In addition, As accumulates in the boundary between the first layer and the second layer. Supposing that the thickness of the polycrystalline Si layers is "a" and the concentration of the P+ type impurities is "b" at that time, after having accumulated the As, it is understood that the P+ type region can be maintained without the heterointerface of the polycrystalline Si layer and the N− type SiC drain region 3 becoming an N+ type.

Figure 5:
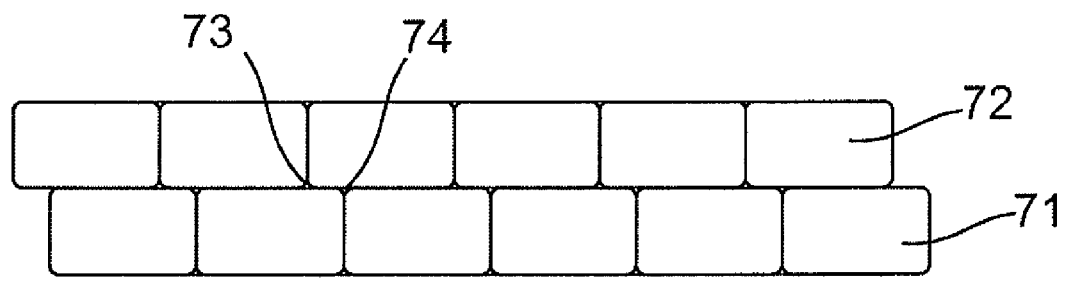
FIG. 5 is a schematic diagram illustrating the spatial relation between accumulated polycrystalline silicon layers.

FIG. 5 is a schematic diagram illustrating the relation between accumulated polycrystalline Si layers 71 and 72. Polycrystalline Si layers 71 and 72 may represent polycrystalline silicon layers 11 and 12, respectively, or polycrystalline layers 21 and 22, respectively. As described above, the second polycrystalline Si layer 72 is formed on the first polycrystalline Si layer 71. A grain boundary 73 of the first polycrystalline Si layer 71 is shifted with respect to a grain boundary 74 of the second layer polycrystalline Si layer 72. Impurities, such as As, accumulate in the interface located at grain boundaries 73 and 74. The accumulation of the impurities in the interface helps to control the depth of diffusion of the impurities, thus permitting formation an N+ type region on the top-most surface and a P+ type region in the bottom-most surface.

In operation, semiconductor 1 exhibits an increased resistance during a reverse-biased state while maintaining a low resistance during the forward-biased state. Particularly, when a voltage applied to gate electrode 7 is below a certain threshold voltage, the element is off. Since a barrier exists at the heterointerface between the first hetero semiconductor portion 4 and the drain region 3, and the second hetero semiconductor portion 5 and the drain region 3, when a voltage below the resistance voltage of the element is applied to the drain electrode 10, the heterointerface prevents current flow between the drain electrode 10 and the source electrode 8. In this manner, the resistance voltage is maintained. Due to the voltage that lingers between the drain electrode 10 and the source electrode 8, a depleted layer expands into the N− type drain region 3.

When the voltage applied to gate electrode 7 is above a certain threshold voltage, the element is on. Due to the electric field from the gate electrode 7, the barrier thickness is reduced at the cross point of the second hetero semiconductor portion 5, the gate insulation film 6 and the N− type SiC drain region 3, and the current flows through with the tunnel current. Between the drain electrode 10 and the source electrode 8, the current flows through the second hetero semiconductor region 5 and the source extraction region 14.

As explained above, the semiconductor device in the present embodiment is formed on one main surface of a semiconductor substrate (consisting of the N+ type SiC substrate 2 and the N− type SiC drain region 3), with a hetero semiconductor region (consisting of the first hetero semiconductor region 4, the second hetero semiconductor region 5, the source extraction region 14 and the contact region 13) wherein the band gap differs from said semiconductor substrate. Gate electrode 7 is formed in the part adjoining the junction of the hetero semiconductor region and the semiconductor substrate through the gate insulation film 6, the source electrode 8 is coupled with said hetero semiconductor region, and the drain electrode 10 is coupled with said semiconductor substrate, and said hetero semiconductor region consists of two or more accumulated semiconductor layers (the first layer polycrystalline Si layer 11 and the second layer polycrystalline Si layer 12).

By assembling the hetero semiconductor region into such laminated structure, a region with impurities of different conductivity types can be formed to the depth direction in the hetero semiconductor region, and as a result, the coexistence of low resistance during forward-biasing and a high resistance during reverse-biasing of the field-effect transistor is made possible by the heterointerface.

In addition, said hetero semiconductor region consists of a first conductivity type (P+ type in our exemplary embodiment) first hetero semiconductor portion 4, the second conductivity type (N+ type in our exemplary embodiment) second hetero semiconductor portion 5, the gate electrode 7 formed in the part adjoining the junction of the second hetero semiconductor portion 5 and the first conductivity type said semiconductor substrate through the gate insulation film 6, the first hetero semiconductor portion 4 connected to the source electrode 8, and the second hetero semiconductor portion 5 connected with the source electrode 8 through the second conductivity type extraction region 14 formed on the first hetero semiconductor portion 4. According to such a composition, the coexistence of the field-effect transistor's low forward-bias resistance and high reverse-bias resistance becomes possible.

Figure 6A:
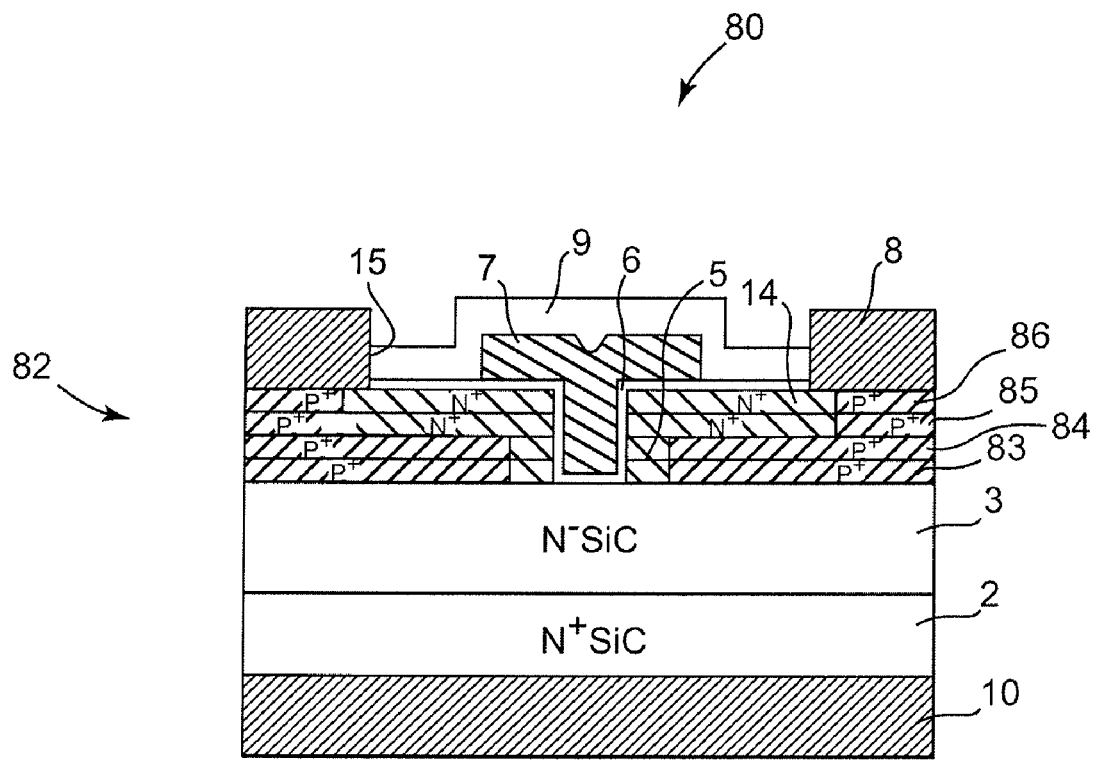
FIGS. 6A and 6B are schematic diagrams illustrating a cross-section of a semiconductor device.
Figure 6B:
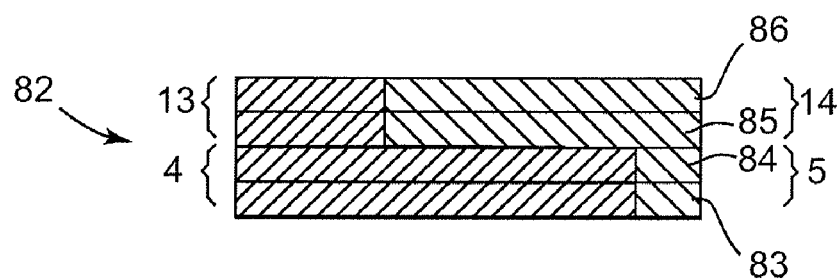

FIGS. 6A and 6B are schematic diagrams illustrating a cross-section of a semiconductor device 80. In the embodiment illustrated in FIGS. 6A and 6B, semiconductor device 80 is a field-effect transistor. Semiconductor device 80 conforms substantially to semiconductor device 1 of FIG. 1, but the hetero region of semiconductor device 80 is formed of from more layers. Particularly, hetero region 82 of semiconductor device 80 is formed from four layers of polycrystalline Si instead of two layers. Hetero region 82 includes a first layer polycrystalline Si 83, a second layer polycrystalline Si 84, a third layer polycrystalline Si 85, and a fourth layer polycrystalline Si 86, which are accumulated one on top of the other. As illustrated in further detail in FIG. 6B, first layer polycrystalline Si 83 and the second layer polycrystalline Si 84 comprise the P+ type first hetero semiconductor portion 4 and the N+ type second hetero semiconductor portion 5. In addition, the third layer polycrystalline Si 85 and the fourth layer polycrystalline Si 86 comprise the P+ type contact region 13 and the N+ type source extraction region 14. In this manner, each of the structures within the hetero region is formed from more than a single layer of polycrystalline Si. Such construction may increase the amount of suppression of impurities introduced to into the polycrystalline Si layers. Semiconductor 80 operates in the same fashion as semiconductor device 1 of FIG. 1.

Figure 7A:
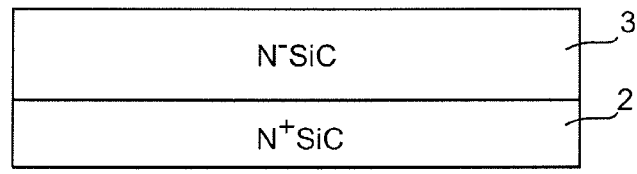
FIGS. 7A-7D are schematic diagrams illustrating an exemplary method of manufacturing of a semiconductor device.

FIGS. 7A-7D are schematic diagrams illustrating the manufacturing of semiconductor device 80 of FIG. 6. Initially, N− type SiC drain region 3 is deposited on one of the main surfaces of N+ type SiC substrate 2, as illustrated in FIG. 7A.

Figure 7B:
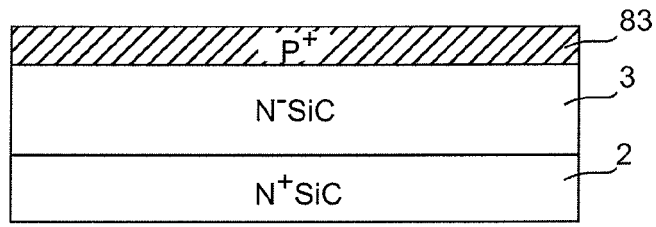
Figure 7C:
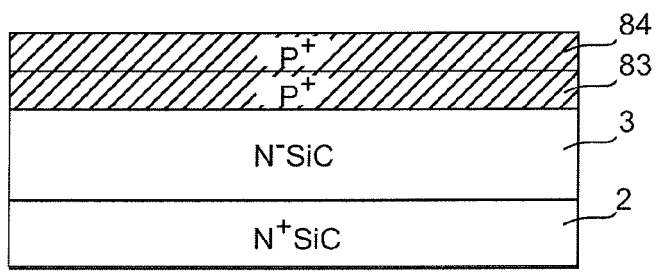

A first layer of polycrystalline Si 83 is formed on a surface of N− type SiC drain region 3, as illustrated in FIG. 7B. Impurities may be introduced to polycrystalline Si layer 83 to convert to a P+ type. FIG. 7C illustrates a second polycrystalline Si layer 84 that is formed on a top surface of polycrystalline Si layer 83. As described above with respect to polycrystalline Si layer 83, impurities may be introduced to the polycrystalline Si layer 84 to convert to a P+ type layer.

Figure 7D:
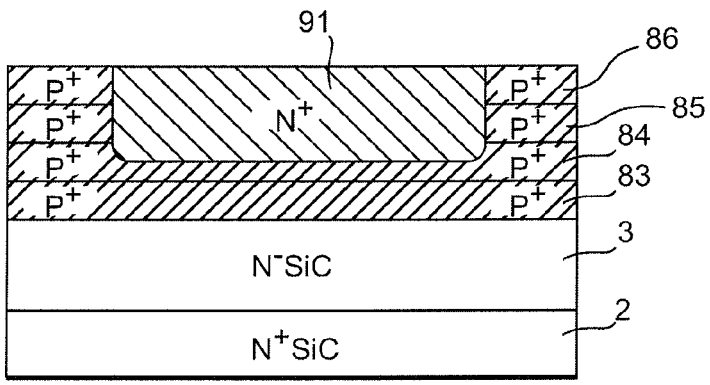

A third layer of polycrystalline Si 85 is formed on a top surface of polycrystalline Si layer 84, and a fourth layer polycrystalline Si 86 is formed on a top surface of polycrystalline Si layer 85, as illustrated in FIG. 7D. Impurities may be introduced into layers 85 and 86 in the same manner described above to convert the layer to a P+ type layer. Although in the embodiment illustrated in FIGS. 7A-D impurities are introduced at each layer to convert the layer to a P+ type layer, the frequency of introduction of the impurities may be reduced. For example, the impurities may be introduced after forming the first two layers and then again after forming the fourth layer. Each of polycrystalline Si layers 83-86 may be electrically connected by low resistance connections.

Impurities that are selectively converted to N+ type are introduced into a region of polycrystalline Si layer 86 to form an N+ type impurity region 91 that constitutes the N+ type source extraction region 14 in FIG. 6. The N+ type impurities may diffuse through polycrystalline layers 85, 86 and partially through layer 84. Alternatively, the N+ type impurities may not diffuse into polycrystalline layer 84 at all. The use of multiple polycrystalline layers further suppresses the depth of diffusion of the impurities within polycrystalline Si layers 83-86. Assembling the polycrystalline Si into a multilayer laminated structure, a region having impurities with different conductivities can be formed downward into the depth of the polycrystalline Si layer, and as a result, the coexistence of the field-effect transistor's low on and high off voltage is made possible by the hetero interface. Since the other processes occur in the same way as those explained in FIGS. 2E-2J, the explanation is omitted.

Figure 8A:
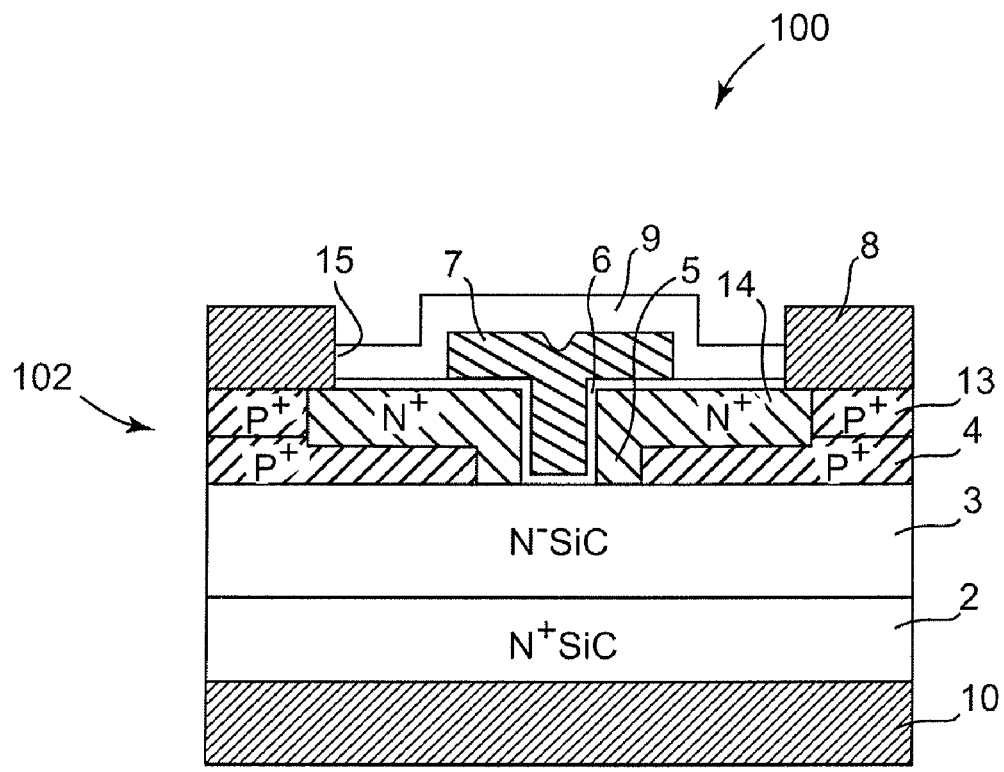
FIGS. 8A and 8B are schematic diagrams illustrating another exemplary semiconductor device.
Figure 8B:
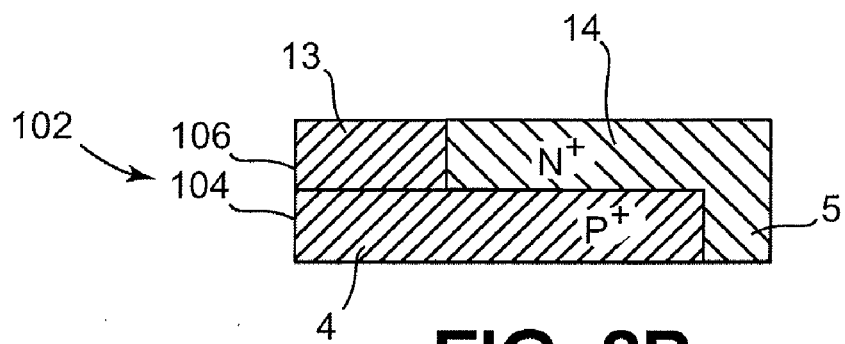

FIGS. 8A and 8B are schematic diagrams illustrating a semiconductor device 100, such as a field-effect transistor. Semiconductor device 100 conforms substantially to semiconductor device 1 of FIG. 1, except that the thickness of second hetero semiconductor portion 5 is substantially similar to polycrystalline Si portion 4. The second polycrystalline Si layer 106 is formed on top of the first polycrystalline Si layer 104. The second polycrystalline Si layer 106 is formed in order to cover the edge of the first polycrystalline Si layer 104. The first polycrystalline Si layer 104 consists of the P+ type first hetero semiconductor portion 4. The second layer polycrystalline Si layer 106 consists of the P+ type contact region 13, the N+ type source extraction region 14, and consecutive N+ type second hetero semiconductor portion 5.

An interface exists between the P+ type first hetero semiconductor portion 4 and the N+ type second hetero semiconductor portion 5. The horizontal diffusion of impurities from the first hetero semiconductor portion 4 to the second hetero semiconductor portion 5 is controlled by the interface between the P+ type first hetero semiconductor portion 4 and the N+ type second hetero semiconductor portion 5. The second hetero semiconductor portion 5 may be formed in very narrow area so that the thickness is similar to the polycrystalline Si layer, resulting in the field-effect transistor having a high off voltage, while achieving low on voltage.

FIG. 9A-9K is a schematic diagram illustrating an exemplary manufacturing method for forming a semiconductor device 200. Semiconductor device 200 conforms substantially to semiconductor device 1 of FIG. 1, but the hetero semiconductor region of semiconductor device 200 is a single layer. An N− type SiC drain region 3 is formed on a main surface of an N+ type SiC substrate 2. N− type drain region 3 may, for example, have an impurity concentration of $10^{14}$ to $10^{18}$ cm$^{-3}$, and thickness between 1 to 100 μm. A polycrystalline silicon layer 204 is formed on the N− SiC drain region 3. A resist mask 206 is formed on top of polycrystalline Si layer 204. The resist mask may be formed using photolithography and may further be formed into a specified pattern.

Figure 9A:
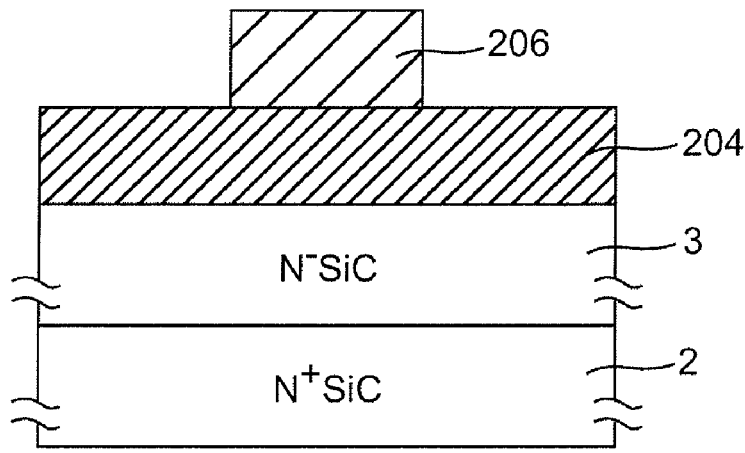
FIG. 9A-9K is a schematic diagram illustrating an exemplary manufacturing method for forming a semiconductor device.
Figure 9B:
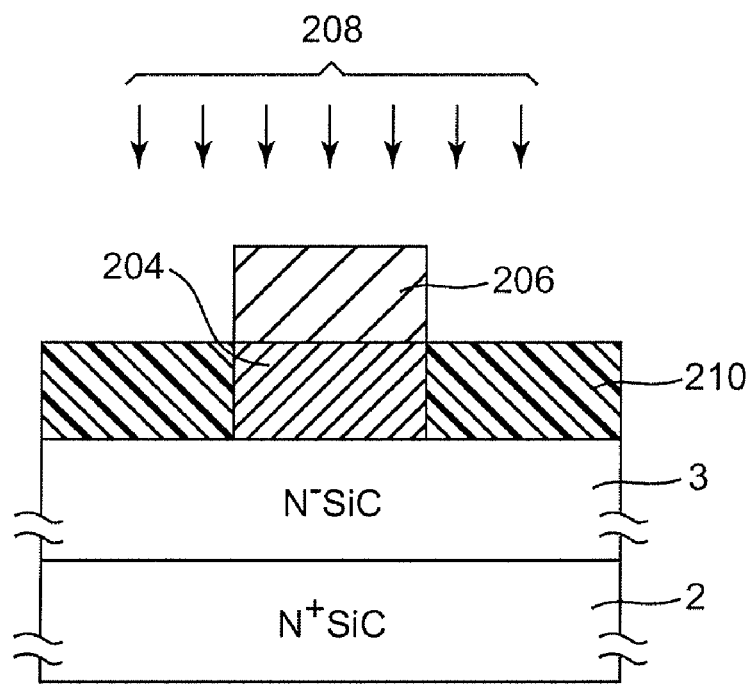

Using the resist mask 41 as a mask, a P type impurity 208 is ion-injected into the polycrystalline silicon layer 204 to form a P type polycrystalline silicon layer 210, as illustrated in FIG. 9B. Either a P+ type or a P− type impurity may be used to form P type polycrystalline silicon layer 210. In one embodiment, boron (B) may be used as the P type impurity 208. After injecting the impurities, resist mask 206 may be removed. If necessary, heat treatment may be conducted to diffuse the impurities to the base of the polycrystalline silicon layer 210.

Figure 9C:
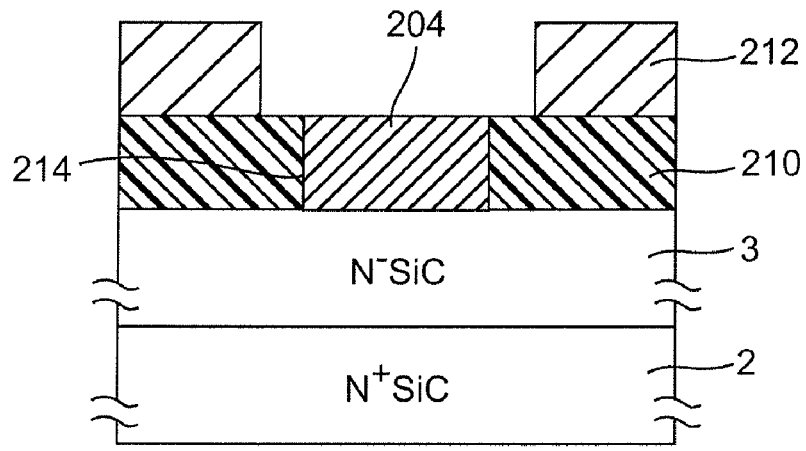
Figure 9D:
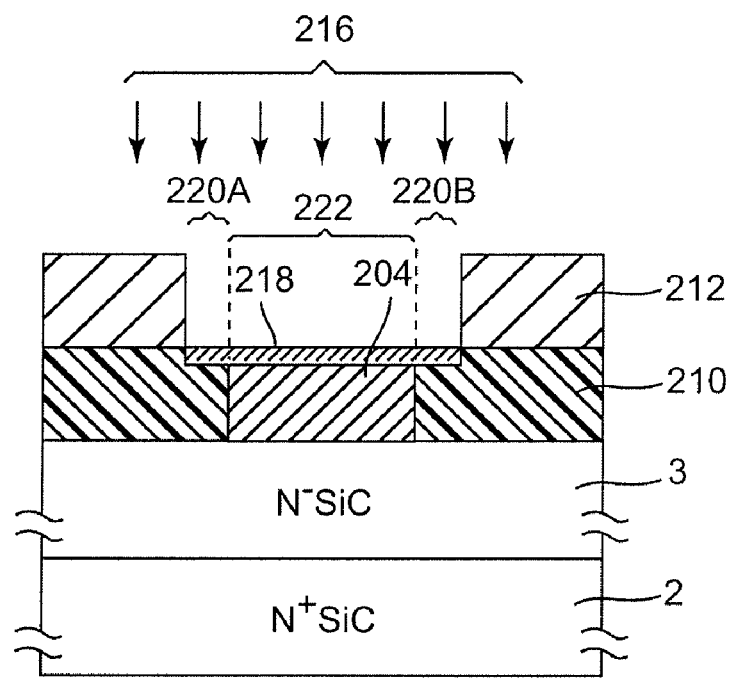

A second resist mask 212 is formed on the polycrystalline silicon layer 210, as illustrated in FIG. 9C. Resist mask 212 forms an opening pattern by offsetting outside of a boundary 214 between polycrystalline silicon layer 204, which is not doped with the P type impurities, and polycrystalline silicon layer 210.

N type impurities 216 are ion-injected into non-doped polycrystalline silicon layer 204 and a portion of P type polycrystalline silicon layer 210 to form N type polycrystalline silicon layer 218. More particularly, polycrystalline silicon layer 218 comprises doped regions 220A and b ("doped regions 220") that is a region in which the N type impurities are injected into the P type polycrystalline silicon layer 210 and region 222 that is a region in which the N type impurities are injected into the non-doped polycrystalline silicon layer 204. N type impurity 216 may, for example, comprise arsenic, phosphorus, or the like. Resist mask 212 may be removed after the N type impurities are injected to form N type polycrystalline silicon layer 218.

Figure 9E:
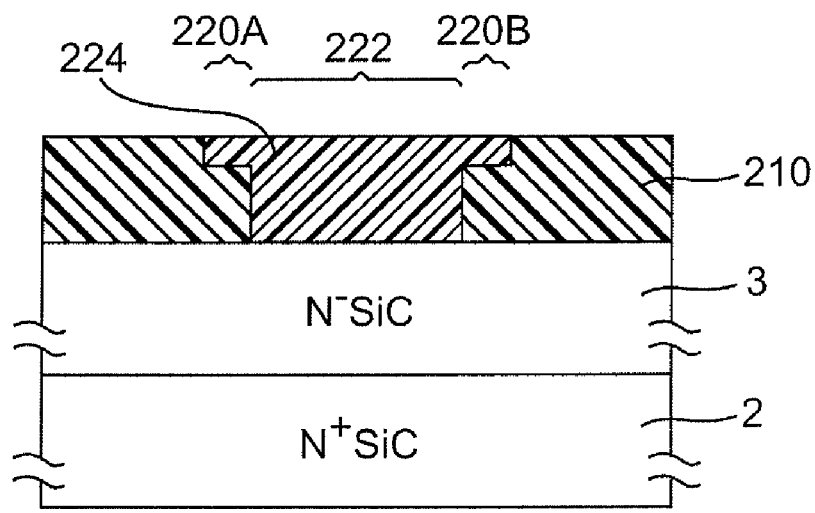

As illustrated in FIG. 9E, a heat treatment may be applied to the N type impurities to activate and thermally diffuse the N type impurities further into regions 220 and 222. The diffusion coefficient is different between the region 220 and the region 222 due to the P type doping of regions 220, as further illustrated in FIG. 10 below. In regions 220, the N type impurity is distributed depthwise. In regions 220 the higher diffusion coefficient causes the concentration of the N type impurity at the surface of the doped regions 220 is higher than the concentration of the N type impurity that at the base of doped regions 220. In other words, the surface of the polycrystalline silicon layer of regions 220 is an N type and the base is a P type. On the other hand, the N type impurities have a relatively flat distribution within region 222. Thus, both the surface and the base of the polycrystalline silicon layer within region 222 become N type. As such, an N type polycrystalline silicon layer 224 is formed. In this manner, difference in the diffusion coefficient of the N type impurity in the doped P type polycrystalline silicon layer 210 and that of the N type impurity in the non-doped polycrystalline silicon layer 204 is utilized to form a deep N type region reaching the SiC epitaxial layer 3 and a shallow N type region (the surface layer of the N type polycrystalline silicon 224) for electrically connecting said N type region with the source electrode 9 in a single impurity injection.

Figure 9F:
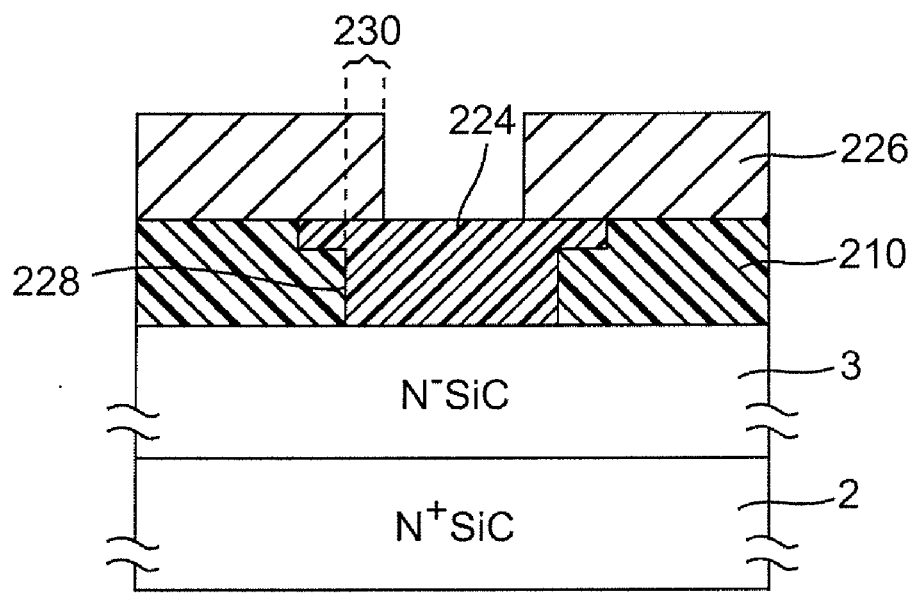

A third resist mask 226 is formed over the uppermost layer, as illustrated in FIG. 9F. Resist mask 226 forms an opening pattern with edges that are offset inside of a boundary 228 between P type polycrystalline silicon layer 210 and N type polycrystalline silicon layer 224. The offset between resist mask 226 and boundary 228 has a width 230.

Figure 9G:
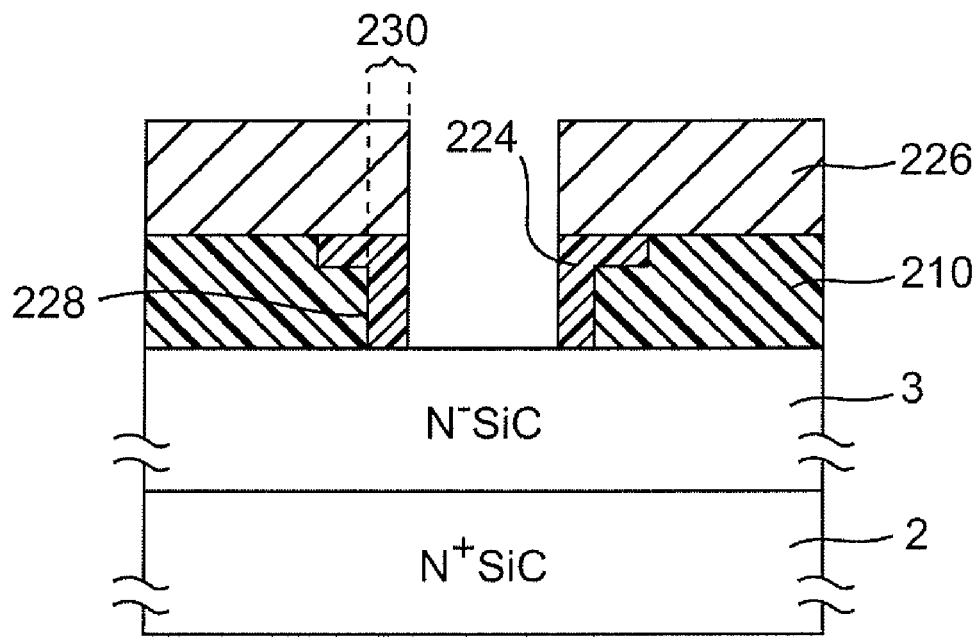
Figure 9H:
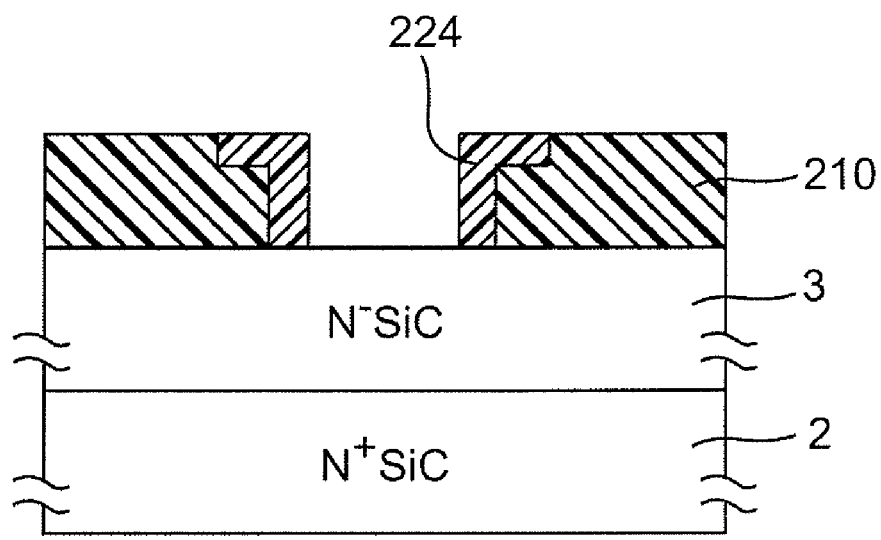

N type polycrystalline silicon layer 224 is etched using resist mask 226, as shown in FIG. 9G. N type polycrystalline silicon layer 224 is etched to remove the portion of N type polycrystalline silicon layer 224 inside offset portion 230 of resist mask 226. Polycrystalline silicon layer 224 is etched down to N− SiC layer 3. in this manner, N type polycrystalline silicon layer 224, which bonds with the N− type SiC epitaxial layer 3 is the same width 230 as the offset between resist mask 226 and boundary 228. Resist mask 226 may be removed, as illustrated in FIG. 9H.

Figure 9I:
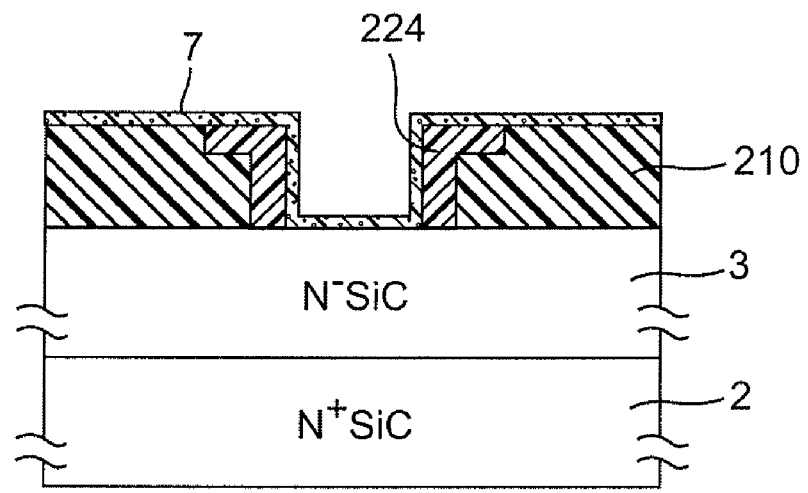
Figure 9J:
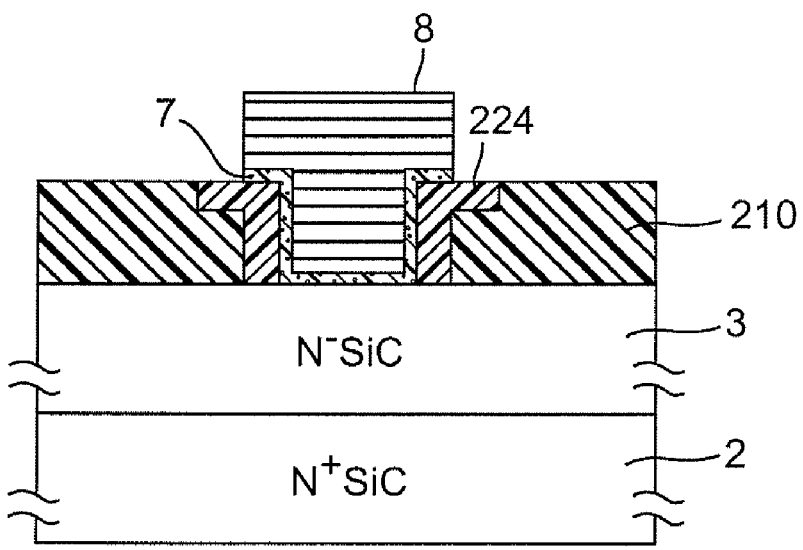

As illustrated in FIG. 9I, a gate insulation film 232 is formed over the P type polycrystalline layer 210, the N type polycrystalline layer 224 and the exposed portion of N− SiC layer 3. A gate electrode 8 is formed proximate to the portion of the exposed portion of N—SiC layer 3, as illustrated in FIG. 9J. Particularly, a gate electrode material is coated on gate insulation film 7, a resist mask with a specified pattern (not shown in FIG. 9J) is formed by photolithography, and a gate electrode 8 is formed by copying the resist pattern by dry etching. Gate electrode 8 may be formed of a material such as polycrystalline silicon, metal and the like.

Figure 9K:
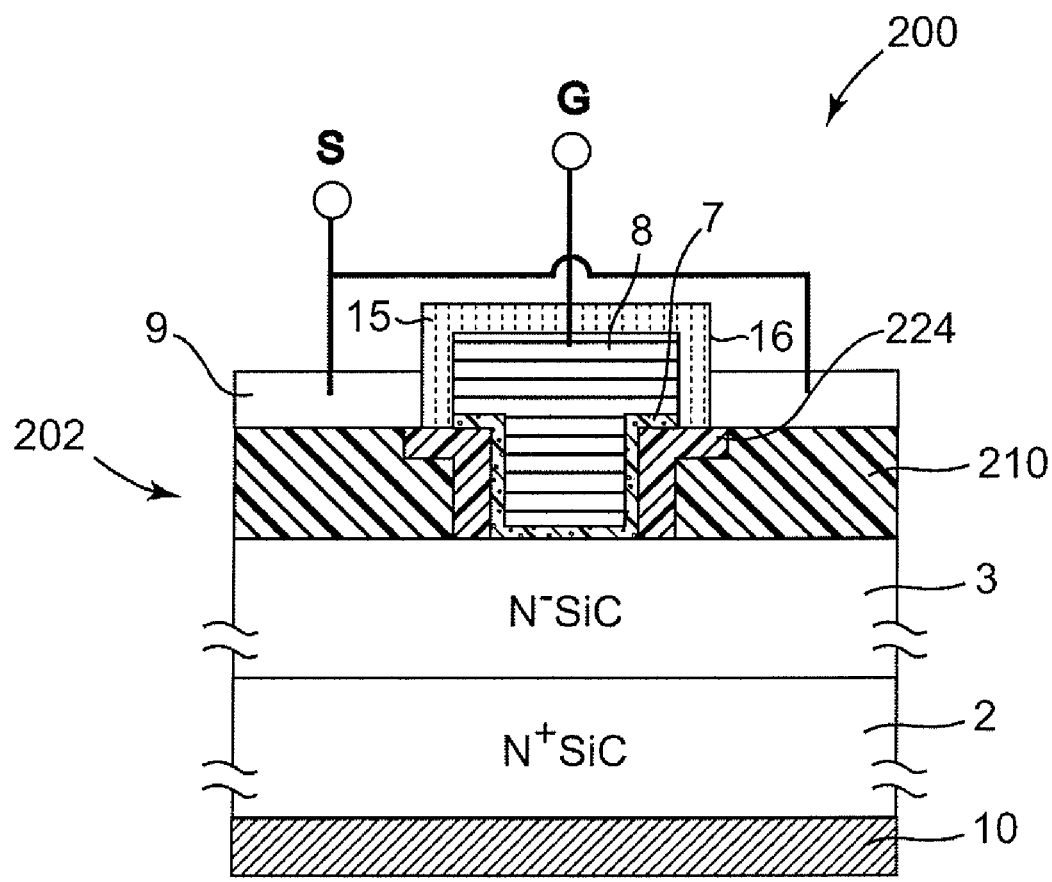

FIG. 9K illustrates the final manufacturing steps for forming semiconductor 200. An interlayer insulation film 15 is formed over gate electrode 8. A contact hole 16 is formed on the interlayer insulation film 15. A source electrode 9 is electrically connected to P type polycrystalline silicon portion 210 and N type polycrystalline silicon 224. A drain electrode 10 is electrically connected to the N+ type SiC substrate 1.

Although in the embodiment described in FIG. 9 the hetero semiconductor region is a single layer, a multiple-layered hetero semiconductor region may be used as described in FIGS. 1-8.

Figure 10:
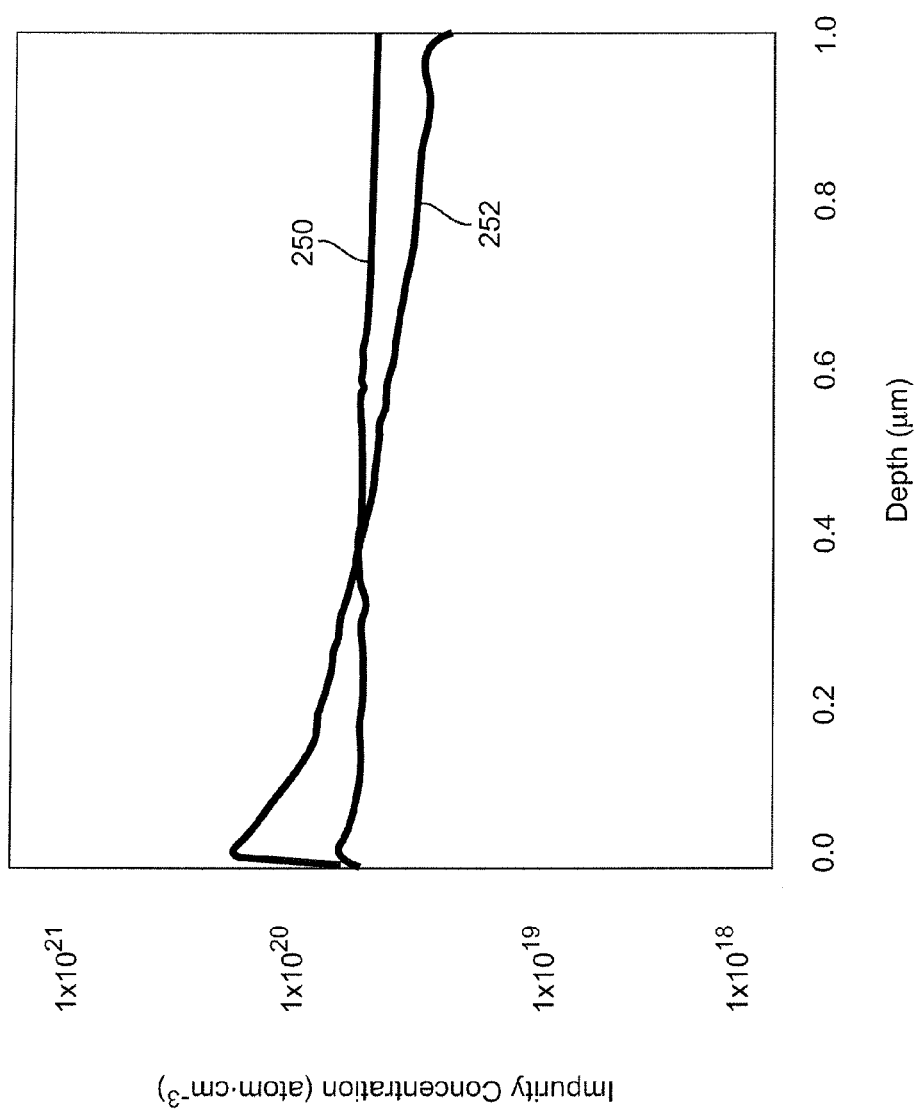
FIG. 10 is a graph showing the results of diffusion of an N type impurity when injected into a partially doped and partially non-doped polycrystalline silicon layer.

FIG. 10 is a graph showing the results of diffusion of an N type impurity, such as an arsenic impurity, when injected into a partially doped and partially non-doped polycrystalline silicon layer. Concentration in the polycrystalline silicon layer is plotted by assuming the depth from the surface as a transverse axis and using secondary ion mass spectrometry (SIMS). The thickness of the polycrystalline silicon layer is 1 μm. When injecting arsenic in the polycrystalline silicon layer in which the impurities are not doped 250, the arsenic distribution becomes flat and the impurities diffuse to the base of the polycrystalline silicon layer. On the other hand, when injecting arsenic in the P type polycrystalline silicon layer 252, the arsenic is distributed depthwise, with the arsenic concentration at the surface side higher than that at the base. The present invention reduces the number of manufacturing steps and provides a semiconductor device with less variation in characteristics by utilizing these properties.

Various embodiments of the invention have been described. These and other embodiments are within the scope of the following claims.

The invention claimed is:

1. A semiconductor device comprising:
a semiconductor region that is formed on a surface of a semiconductor substrate, the semiconductor region including
 a first hetero semiconductor portion having an impurity of a first conducting type in at least a bottom layer of the semiconductor region,
 a second hetero semiconductor portion having an impurity of a second conducting type in at least the bottom layer of the semiconductor region,
 a band gap that is different from a band gap of the semiconductor substrate,
 more than two accumulated semiconductor layers and
 junctions disposed between the more than two accumulated semiconductor layers;
a gate electrode adjoining a heterojunction between the second hetero semiconductor portion and the semiconductor substrate through a gate insulation film, the second hetero semiconductor portion being between the first hetero semiconductor portion and the gate electrode;
a source electrode coupled to the first and second hetero semiconductor portions of the semiconductor region; and
a drain electrode coupled to the semiconductor substrate.

2. The semiconductor device of claim 1, wherein
the first conducting type comprises a P type and the second conducting type comprises an N type.

3. The semiconductor device of claim 2, wherein
the P type comprises a P+ type and the N type comprises an N+ type.

4. The semiconductor device of claim 1, further comprising
an extraction region of the second conductivity type formed in the semiconductor region, the second hetero semiconductor portion being connected to the source electrode through the extraction region, the first hetero semiconductor portion being coupled to the source electrode.

5. The semiconductor device of claim 2, further comprising
an extraction region of the second conductivity type formed in the semiconductor region, the second hetero semiconductor portion being connected to the source electrode through the extraction region, the first hetero semiconductor portion being coupled to the source electrode.

6. A semiconductor device, comprising:
a semiconductor region that is formed on a surface of a semiconductor substrate, the semiconductor region including
 a first semiconductor portion of a first conducting type,
 a second semiconductor portion of a second conducting type,
 a band gap that is different from a band gap of the semiconductor substrate,
 more than two accumulated semiconductor layers into which an impurity of the first conducting type is introduced, respectively, and
 junctions disposed between the more than two accumulated semiconductor layers;
a gate electrode adjoining a heterojunction between the second semiconductor portion and the semiconductor substrate through a gate insulation film;
a source electrode coupled to the semiconductor region; and
a drain electrode coupled to the semiconductor substrate,
the more than two accumulated semiconductor layers of the semiconductor region comprising
 a first semiconductor layer comprising the first and second semiconductor portions, and
 a second semiconductor layer comprising an extraction region of the second conducting type and a contact region of the first conducting type, the extraction region coupling the source electrode to the second semiconductor portion, the contact region coupling the source electrode to the first semiconductor portion.

7. The semiconductor device of claim 2, wherein
the more than two accumulated semiconductor layers of the semiconductor region comprise
 a first semiconductor layer comprising the first and second hetero semiconductor portions, and
 a second semiconductor layer comprising an extraction region of the second conducting type and a contact region of the first conducting type, the extraction region coupling the source electrode to the second hetero semiconductor portion, the contact region coupling the source electrode to the first hetero semiconductor portion.

8. The semiconductor device of claim 4, wherein
the more than two accumulated semiconductor layers of the semiconductor region comprise
 a first semiconductor layer comprising the first and second hetero semiconductor portions, and
 a second semiconductor layer comprising the extraction region of the second conducting type and a contact region of the first conducting type, the contact region coupling the source electrode to the first hetero semiconductor portion.

9. The semiconductor device of claim 1, wherein
the semiconductor substrate comprises one of SiC, GaN or diamond.

10. The semiconductor device of claim 1, wherein
the semiconductor region comprises one of a single crystal, amorphous, or polycrystalline Si, GaAs, Ge, or SiGe.

11. The semiconductor device of claim 6, wherein
the first conducting type comprises a P type and the second conducting type comprises an N type.

12. The semiconductor device of claim 11, wherein
the P type comprises a P+ type and the N type comprises an N+ type.

* * * * *